(12) United States Patent
Onodera

(10) Patent No.: US 8,423,944 B2
(45) Date of Patent: Apr. 16, 2013

(54) SUPPORTING PROGRAM, DESIGN SUPPORTING DEVICE AND DESIGN SUPPORTING METHOD

(75) Inventor: Mitsuru Onodera, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 319 days.

(21) Appl. No.: 12/640,677

(22) Filed: Dec. 17, 2009

(65) Prior Publication Data

US 2010/0218153 A1    Aug. 26, 2010

(30) Foreign Application Priority Data

Feb. 25, 2009  (JP) ................. 2009-043040

(51) Int. Cl.
*G06F 17/50* (2006.01)
(52) U.S. Cl.
USPC .......................................... 716/124; 716/125
(58) Field of Classification Search .......... 716/106–110, 716/124, 125, 131
See application file for complete search history.

(56) References Cited

U.S. PATENT DOCUMENTS

| 2004/0254776 | A1 | 12/2004 | Andou |
| 2005/0081171 | A1 | 4/2005 | Kawano et al. |
| 2006/0109032 | A1* | 5/2006 | Hosono ........................... 327/41 |
| 2007/0089077 | A1 | 4/2007 | Sumikawa |
| 2008/0178134 | A1* | 7/2008 | Akamine et al. .................. 716/6 |

FOREIGN PATENT DOCUMENTS

| JP | 2005-122298 | 5/2005 |
| JP | 2007-109138 | 4/2007 |
| WO | 03/060776 | 7/2003 |

\* cited by examiner

*Primary Examiner* — Binh Tat
(74) *Attorney, Agent, or Firm* — Staas & Halsey LLP

(57) ABSTRACT

A design supporting method includes partitioning a partition path of circuit information into partitioned paths based on a given condition, calculating a variation value of each of the partitioned paths based on variation values on a delay of a cell included in the corresponding partitioned path, calculating a partition propagation delay time of each of the partitioned paths based on the variation value of the corresponding partitioned path, and calculating a source propagation delay time of the source path by merging the propagation delay time of each of the partitioned paths.

7 Claims, 16 Drawing Sheets

| CELL TYPE | CELL VARIATION VALUE [%] | INPUT PIN CAPACITY |
|---|---|---|
| INV1 | 8.7 | q1 |
| INV2 | 16.26 | q2 |
| INV3 | 12.56 | q3 |
| INV4 | 10.27 | q4 |
| INV5 | 17.48 | q5 |
| AND1 | 15.8 | q6 |
| ... | ... | ... |
| NOR1 | 13.77 | q7 |
| ... | ... | ... |
| BUF1 | 11.01 | q8 |
| ... | ... | ... |

SUPPORTING PROGRAM, DESIGN SUPPORTING DEVICE AND DESIGN SUPPORTING METHOD

CROSS-REFERENCE TO RELATED APPLICATIONS

This application claims the benefit of priority from Japanese Patent Application No. 2009-43040 filed on Feb. 25, 2009, the entire contents of which are incorporated herein by reference.

BACKGROUND

1. Field

Embodiments discussed herein relate to a design supporting method of calculating a delay time of a semiconductor integrated circuit.

2. Description of the Related Art

In a semiconductor integrated circuit (LSI), a timing margin of a signal is reduced and hence timings are verified by taking a signal propagation delay time into consideration upon designing the LSI. A delay occurs in signal propagation depending on three factors: a process (P), a temperature (T) and a supply voltage (V).

Related art is disclosed in International Publication WO2003/060776.

SUMMARY

According to one aspect to the embodiments, a design supporting method includes partitioning a partition path of circuit information into partitioned paths based on a given condition, calculating a variation value of each of the partitioned paths based on variation values on a delay of a cell included in the corresponding partitioned path, calculating a partition propagation delay time of each of the partitioned paths based on the variation value of the corresponding partitioned path, and calculating a source propagation delay time of the source path by merging the propagation delay time of each of the partitioned paths.

Additional advantages and novel features of the invention will be set forth in part in the description that follows, and in part will become more apparent to those skilled in the art upon examination of the following or upon learning by practice of the invention.

The above-described embodiments of the present invention are intended as examples, and all embodiments of the present invention are not limited to including the features described above.

DETAILED DESCRIPTION OF THE PREFERRED EMBODIMENTS

Figure 1:
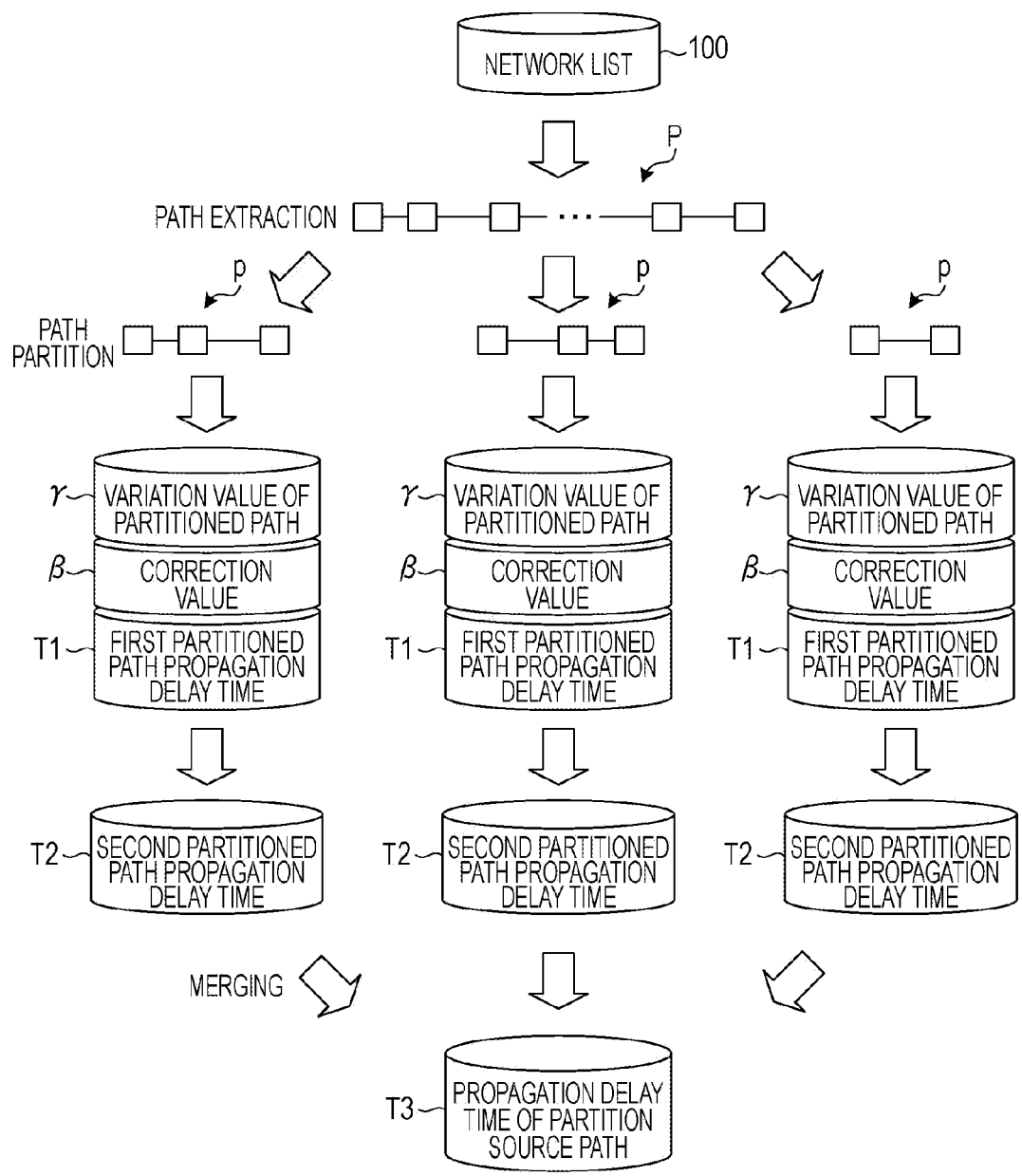
FIG. 1 illustrates a first embodiment.

Reference may now be made in detail to embodiments of the present invention, examples of which are illustrated in the accompanying drawings, wherein like reference numerals refer to like elements throughout.

Logical simulation may be performed under a condition in which a delay time is maximized (a MAX condition), a condition in which the delay time is made typical (a TYP condition) and a condition in which the delay time is minimized (a MIN condition), considering the above mentioned factors P, T and V. In addition, other factors to vary the signal propagation delay time may be taken into consideration.

The other signal propagation time delay varying factors includes the following factors and may be referred to as, for example, intra-chip variations.

(1) A variation in process characteristics induced by a variation in transistor characteristics, a variation in wiring resistance and a variation in contact resistance,
(2) a variation in supply voltage induced by a voltage drop in a chip and
(3) a variation in intra-chip temperature induced by non-uniform arrangement of elements and non-uniform distribution of operating frequency in an LSI.

A propagation delay time of a path in which the intra-chip variations are considered is calculated, for example, as follows.

$$Ts = T \times \{1 + (\alpha - 1) \times \beta\} \quad (1)$$

In the above equation,
Ts: a path propagation delay time obtained by taking the intra-chip variations and probability distribution into consideration
T: a path propagation delay time under each condition
$\alpha$: a coefficient of variation
$\beta$: a correction value of the coefficient of variation The coefficient of variation (hereinafter referred to as the variation coefficient) $\alpha$ is a value indicating how much a propagation delay time of an element in a signal path and a propagation delay time of wiring in the signal path vary. The variation coefficient $\alpha$ is calculated corresponding to each of the MAX, TYP and MIN conditions. The variation coefficient $\alpha$ is calculated based on, for example, a specific cell.

$\alpha$ = Maximum value up to which a propagation delay time may vary when the intra-chip variations are taken into consideration/Propagation delay time obtained when the intra-chip variations are not taken into consideration   (2)

The correction value $\beta$ is calculated based on a function (a correction function of the variation coefficient $\alpha$) approximating a propagation delay time. The propagation delay time is obtained based on the intra-chip variations as a propagation delay time. The propagation delay time is obtained based on actually generated intra-chip variations in accordance with a number of stages of gates or a number of stages of cells in a signal path. The variation coefficient $\alpha$ is corrected with the correction value $\beta$. The correction value $\beta$ is calculated for which the propagation delay time Ts exhibits a value within a 3σ (sigma) range with occurring probability, for example, in a probability density distribution of the propagation delay time indicated in the form of, for example, a normal distribution. The propagation delay time of low occurring probability may not be calculated.

$$\beta = a\, n-1 \qquad (3)$$

In the equation,
a: the bottom of correction function
n: the number of stages of cells (or the number of stages of gates) in a signal path FIG. 1 illustrates a first embodiment. A network list 100 is read in and source paths P are extracted from within the network list 100. The network list 100 corresponds to circuit information. The source paths P are, for example, data paths or clock paths. Path partition is performed on each extracted path P. A partitioned path variation value γ and its correction value β are calculated per partitioned path p.

The partitioned path variation value γ may be a variation value inherent to each partitioned path and may not be the variation coefficient α of a typical cell as indicated in the equation (1). The correction value β is calculated, for example, from the equation (3). A first partitioned path propagation delay time T1 of each partitioned path is calculated. Although the first partitioned path propagation delay time T1 may correspond to the propagation delay time T in the equation (1), the first partitioned path propagation delay time T1 does not represent a propagation delay time of a path and represents a propagation delay time of a partitioned path. The first partitioned path propagation delay time T1 may be a propagation delay time obtained without taking the partitioned variation value γ into consideration.

A second partitioned path propagation delay time T2 is calculated based on the partitioned path variation value γ, the correction value β and the first partitioned path propagation delay time T1 obtained from each partitioned path p. The second partitioned path propagation delay time T2 may be a propagation delay time obtained by taking the partitioned path variation value γ into consideration. The second partitioned path propagation delay times T2 for individual partitioned paths p are merged to obtain a source path propagation delay time T3 of the source path P.

As the variation coefficient of the source path P, the variation coefficient α of the typical cell is not used and the partitioned variation value for each partitioned path p is used. Therefore, the propagation delay time which is reduced in margin, for example, the second partitioned path propagation delay time T2 is obtained from each partitioned path p. The source path propagation delay time T3 obtained by merging the second partitioned path propagation delay times T2 for per partitioned path p is also reduced in margin, thereby optimizing the propagation delay time.

Figure 2:
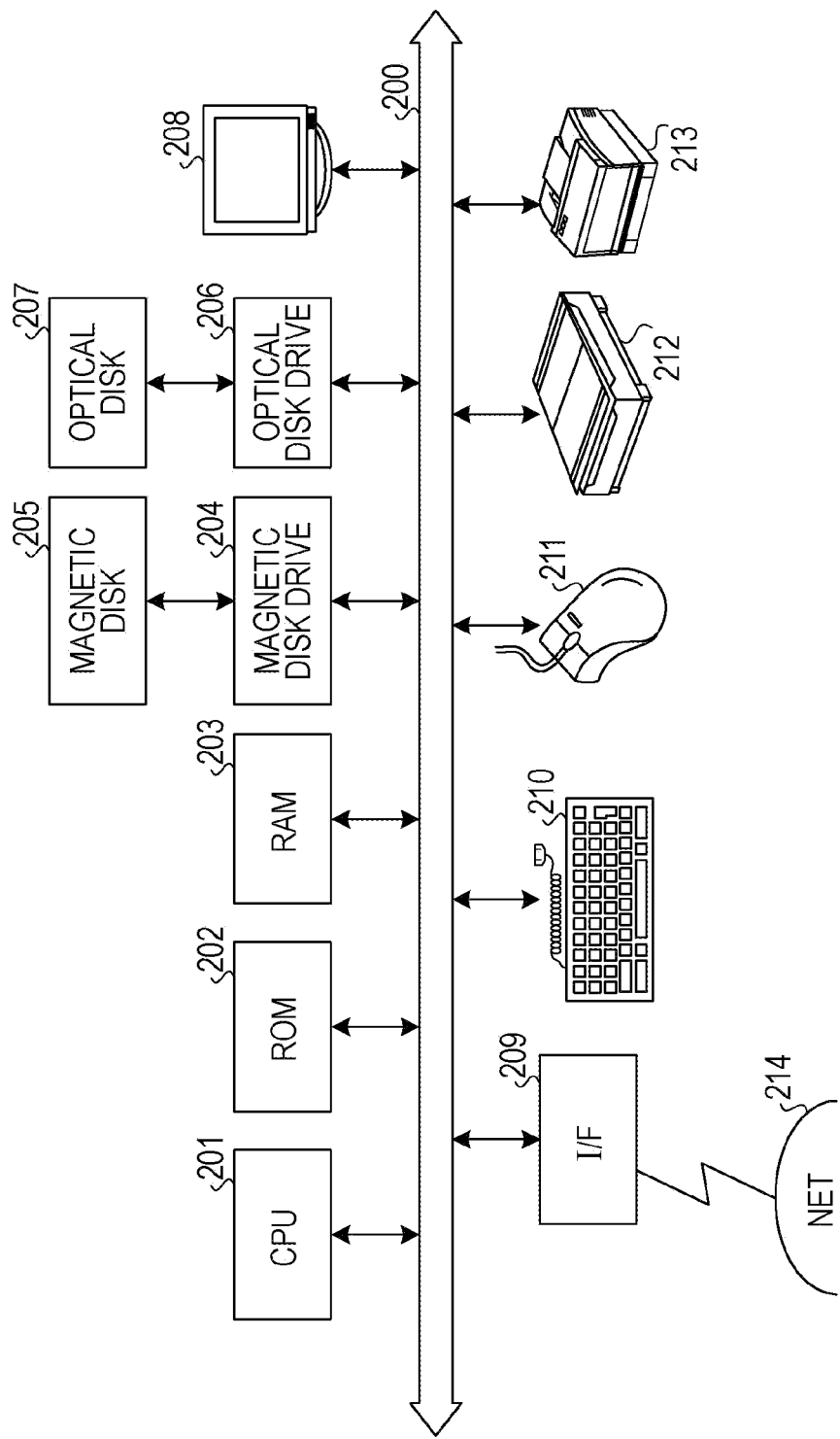
FIG. 2 illustrates an exemplary design supporting device.

FIG. 2 illustrates an exemplary design supporting device. The design supporting device includes a central processing unit (CPU) 201, a read only memory (ROM) 202, a random access memory (RAM) 203, a magnetic disk drive 204, a magnetic disk 205, an optical disk drive 206, an optical disk 207, a display 208, an interface (I/F) 209, a keyboard 210, a mouse 211, a scanner 212 and a printer 213. The abovementioned elements may be coupled together via a bus 200.

The CPU 201 controls the entire design supporting device. The ROM 202 stores a program such as a boot program. The RAM 203 is used as a work area of the CPU 201. The magnetic disk drive 204 controls data reading from the magnetic disk 205 and data writing into the magnetic disk 205 under the control of the CPU 201. The magnetic disk 205 stores data written by the magnetic disk drive 204.

The optical disk drive 206 controls data reading from the optical disk 207 and data writing into the optical disk 207 under the control of the CPU 201. The optical disk 207 stores data written by the optical disk drive 206 and a computer reads data stored in the optical disk 207.

The display 208 displays data such as a cursor, icons, tool boxes, documents, images and function information. The display 208 may include, for example, a CRT, a TFT liquid crystal display or a plasma display.

The interface (I/F) 209 is coupled to each of networks 214 such as Local Area Network (LAN), Wide Area Network (WAN) and Internet via a communication line and is coupled to other devices via the networks 214. The I/F 209 serves as an interface between the networks 214 and internal elements to control data input into the device from an external device and data output from the device to the external device. The I/F 209 may include, for example, a modem or a LAN adapter.

The keyboard 210 includes keys used to input characters, numerals and various instructions to input data. A touch-panel type input pad or ten keys may be used in place of the keyboard. The mouse 211 is used to move the cursor, to select an area, to move a window and to change the size of the window. An element having substantially the same or similar function as/to the mouse as a pointing device, such as a track ball or a joy stick may be used in place of the mouse 211.

The scanner 212 optically reads an image and fetches image data into the design supporting device. The scanner 212 may include an optical character reader (OCR) function. The printer 213 is used to print image data and document data. The printer 213 may be, for example, a laser printer or an ink jet printer.

Figure 3:
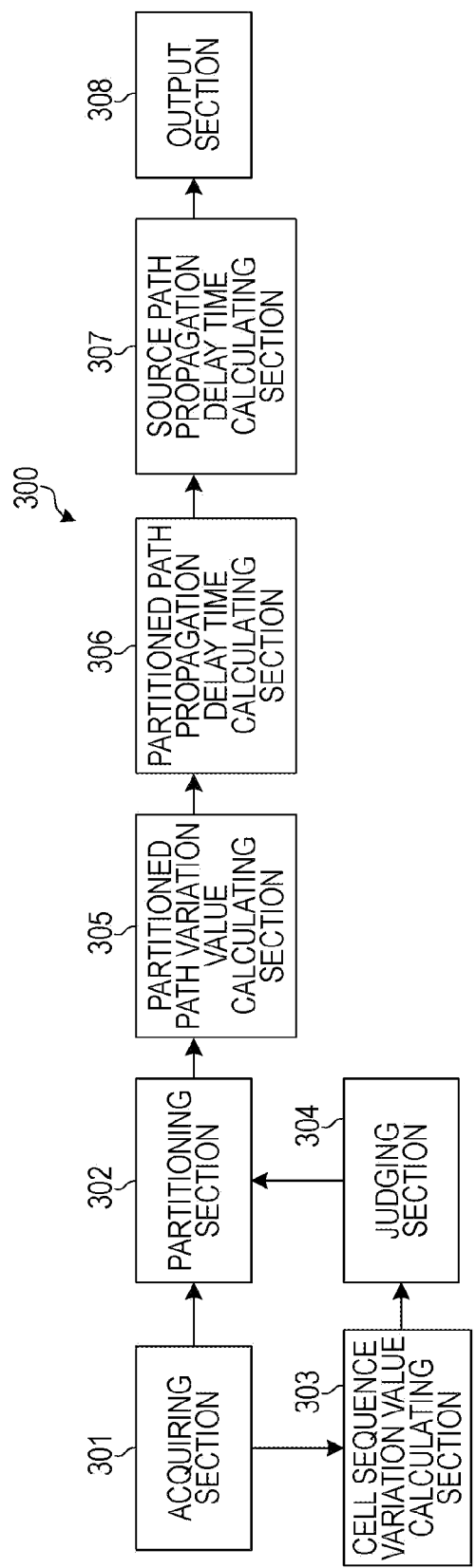
FIG. 3 illustrates an exemplary design supporting device.

FIG. 3 illustrates an exemplary design supporting device. The design supporting device 300 includes an acquiring section 301, a partitioning section 302, a cell sequence variation value calculating section 303, a control section 304, a partitioned path variation value calculating section 305, a partitioned path propagation delay time calculating section 306, a source path propagation delay time calculating section 307 and an output section 308. The above mentioned elements ranging from the acquiring section 301 to the output section 308 may operate by execution of programs stored in storage units such as the ROM 202, the RAM 203, the magnetic disk 205 and the optical disk 207 illustrated in FIG. 2 or programs input via the I/F 209.

The acquiring section 301 acquires the path, for example, from within circuit information. The path includes a group of series of cells and nets ranging from an input terminal to a macro, for example, to a flip flop FF, a group of series of cells and nets between macros, for example, between flip flops FFs, or a group of series of cells and nets ranging from a macro to an output terminal.

The circuit information includes electronic data including cell connection information and may include, for example, the network list 100 illustrated in FIG. 1. Path extraction using an extraction section may be performed by a known method. The acquiring section 301 may fetch a group of paths which have been already extracted into the device from a storage or an external computer.

The partitioning section 302 partitions a source path selected from within a group of paths obtained from the circuit information, for example, the network list 100 into partitioned paths based on a given condition. The given condition may include, for example, a condition that the number of the stages of cells obtained by partitioning is smaller than that of the stages of cells in the source path.

For example, the number of stages of cells to be partitioned is set and the source path is partitioned in units of the set number of stages of cells. In the case that branch points are present in the source path, the path may be partitioned at each branch point as a boundary. Branch-point-based partition reduces influence of a delay error induced by capacity and resistance of metal wiring before and behind each branch point and hence the accuracy of the partitioned path propagation delay time may be increased.

The path may be partitioned in units of continuous cell sequences of substantially the same type. Partition in units of the cells of substantially the same type allows batch calculation and hence the accuracy of the partitioned path propagation delay time may be also increased.

The cell sequence variation value calculating section 303 calculates variation values of cell sequences, for example, in the following manner. The cell sequence variation value calculating section 303 first calculates the variation value of the leading cell sequence based on the variation value of each cell and the number of stages of cells in the leading cell sequence and then calculates the variation value of the trailing cell sequence based on the variation value of each cell and the number of stages of cells in the trailing cell sequence.

The leading cell sequence may be either a cell sequence of cells of substantially the same cell type or a cell sequence of cells of different types. Likewise, the trailing cell sequence may be either a cell sequence of cells of substantially the same type or a cell sequence of cells of different types. In the case that the cells in the cell sequence are of substantially the same type, batch calculation may be performed.

The judging section 304 judges whether partition may be performed based on the variation value of each cell and the number of stages of cells in each of the leading and trailing cell sequences or not. For example, in the case that a difference in variation value between the leading and trailing cell sequences is more than or equal to a given value, partition may be performed. While, in the case that the difference in variation value is not more than or equal to the given value, the partition may not be performed. In the case that the ratio of the variation value of the leading cell sequence to that of the trailing cell sequence is obtained and the ratio is more than or equal to a threshold value, the difference is regarded to be more than or equal to the given value and hence the partition may be performed. While, in the case that the ratio is less than the threshold value, the difference is regarded to be not more than or equal to the given value and hence the partition may not be performed.

Figure 4:
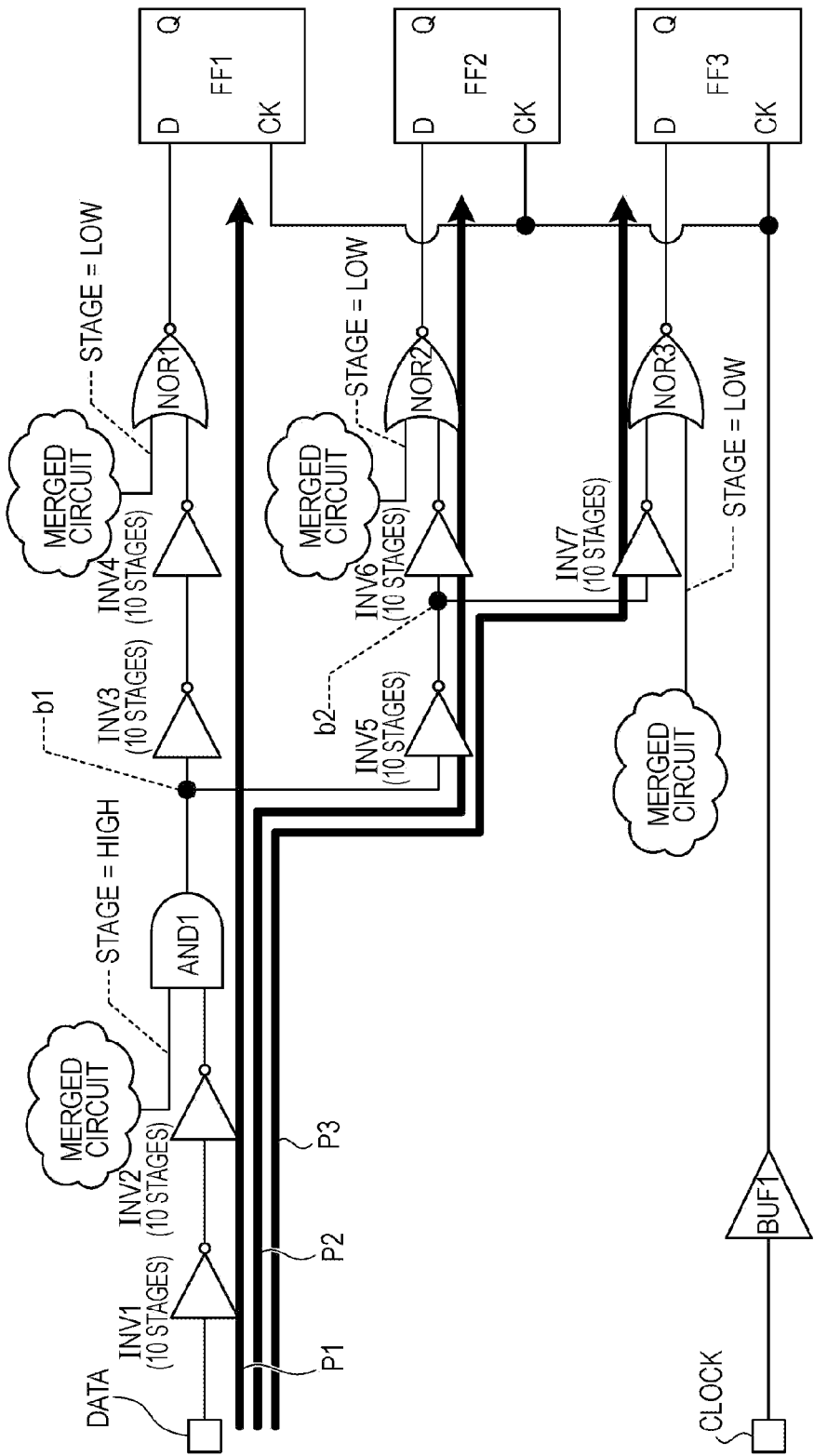
FIG. 4 illustrates an exemplary circuit before partitioned.

Although the path partition is performed in circuit information, for example, the network list 100 illustrated in FIG. 4 will be used for the convenience of explanation.

FIG. 4 illustrates an exemplary circuit before partitioned. In the example illustrated in FIG. 4, data paths P1 to P3 ranging from an input terminal to flip flops FF1 to FF3 are partitioned. In FIG. 4, for simplicity, the number of stages of cells is inscribed after the cell type name for a cell sequence of cells of substantially the same type. For example, "INV1 (ten (10) stages)" means that ten stages of inverters of the cell type INV1 are series-coupled. A cell with no inscription of the stage number is of the type having one stage of inverter.

The data path P1 is a path routing from "DATA" indicative of the data input terminal to the flip flop FF1 in the order of DATA⇒ INV1 (ten stages)⇒ INV2 (ten stages)⇒ AND1 ⇒ INV3 (ten stages)⇒ INV4 (ten stages)⇒ NOR1⇒ FF1. The data path P2 is a path routing from "DATA" indicative of the data input terminal to the flip flop FF2 in the order of DATA⇒ INV1 (ten stages)⇒ INV2 (ten stages)⇒ AND1 ⇒ INV5 (ten stages)⇒ INV6 (ten stages)⇒ NOR2⇒ FF2.

The data path P3 is a path routing from "DATA" indicative of the data input terminal to the flip flop FF3 in the order of DATA⇒ INV1 (ten stages)⇒ INV2 (ten stages)⇒ AND1 ⇒ INV5 (ten stages)⇒ INV7 (ten stages)⇒ NOR3⇒ FF3.

When the path partition is performed, a cell library 500 is referred. The cell library 500 corresponds to a database in which cells are stored in units of cell types. The cell library 500 may be included in a storage such as the ROM 202, the RAM 203, the magnetic disk 205 or the optical disk 207 illustrated in FIG. 2.

Figure 5:
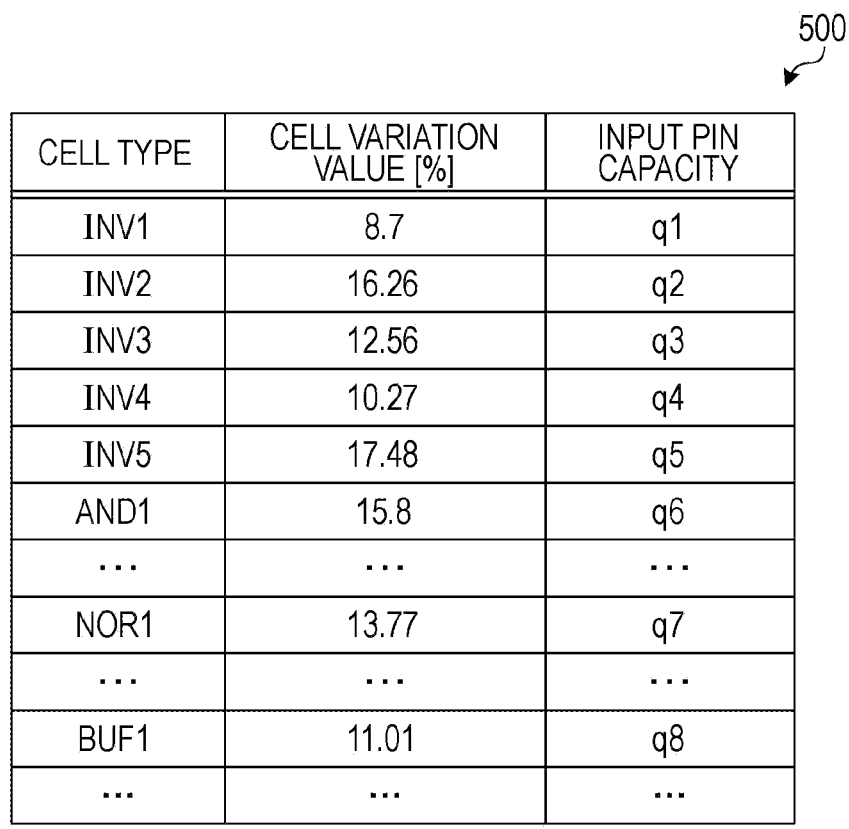
FIG. 5 illustrates an exemplary cell library.

FIG. 5 illustrates an exemplary cell library. In the cell library 500, the cell types, cell variation values and input pin capacities are stored in units of cell types. The cell type may be an identification code indicative of the type of a cell. Inverters may include inverters of, for example, five types INV1 to INV5.

Figure 6:
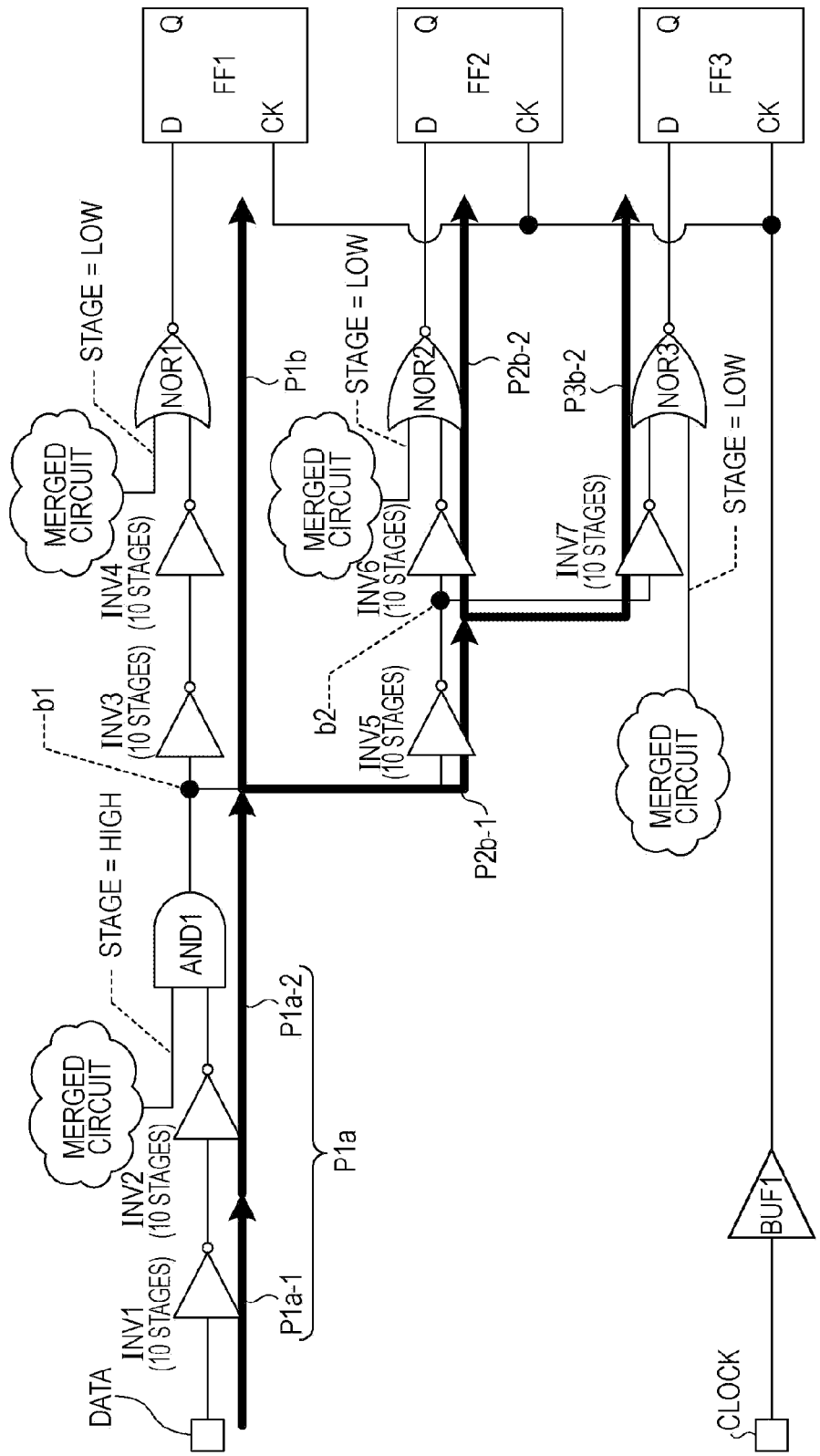
FIG. 6 illustrates an exemplary circuit after partitioned

FIG. 6 illustrates an exemplary circuit obtained after partitioned. The data path P1 is partitioned into, for example, a partitioned path P1a and a partitioned path P1b at a branch point b1. The data path P2 is partitioned into, for example, the partitioned path P1a, a partitioned path P2b-1 and a partitioned path P2b-2 at the branch point b1 and a branch point b2. The data path P3 is partitioned into, for example, the partitioned path P1a, the partitioned path P2b-1 and a partitioned P3b-2 at the branch points b1 and b2.

In the partitioned path P1a, the leading cell sequence INV1 (ten stages) and the trailing cell sequence INV2 (ten stages) whose cell type is different from that of the leading cell sequence are series-coupled. The variation value of each cell sequence of substantially the same cell type is obtained by multiplying the cell variation value and the number of stages of cells. Therefore, the variation value of the leading cell sequence INV1 (ten stages) may be 87 (=8.7×10). Likewise, the variation value of the trailing cell sequence INV2 (ten stages) may be 162.6 (=16.26×10).

The ratio of the variation value of the trailing cell sequence to the variation value of the leading cell sequence may be 50% {≈(87/162.6)×100}. For example, when the threshold value is 40%, the ratio between the variation values is more than the threshold value and the variation values of the both cell sequences differ from each other. Therefore, the judging section 304 judges that partition may be performed and the leading cell sequence INV1 (ten stages) is partitioned as a partitioned path P1a-1 and the succeeding cell sequence INV2 (ten stages) is partitioned as a partitioned path P1a-2 in accordance with judgment.

The partitioned path variation value calculating section 305 illustrated in FIG. 3 calculates the partitioned path variation value γ based on the variation value of a delay of each cell in the partitioned path per partitioned path partitioned by the partitioning section 302. The partitioned path variation value γ may be an average value of the cell variation values of cells included in a partitioned path.

The partitioned path propagation delay time calculating section 306 calculates the second partitioned path propagation delay time T2 based on the partitioned path variation value γ calculated by the partitioned path variation value calculating section 305 per partitioned path obtained by the partitioning section 302. The second partitioned path propagation delay time T2 is calculated, for example, using the following equation (4) per partitioned path.

$$T2 = \gamma \times \beta \times T1 \quad (4)$$

The correction value β is calculated from the following equation (5) wherein "n" is the number of stages of cells in a partitioned path.

$$\beta = 1/\sqrt{n} \quad (5)$$

The first partitioned path propagation delay time T1 in which the partitioned path variation value γ is not taken into consideration is obtained by calculating the sum of the delay times of the cells in the partitioned path. For example, the delay time of each cell is calculated using, for example, the cell library 500, a wiring library 700, a delay characteristics graph 800 and a throughput characteristics graph 900.

Figure 7:
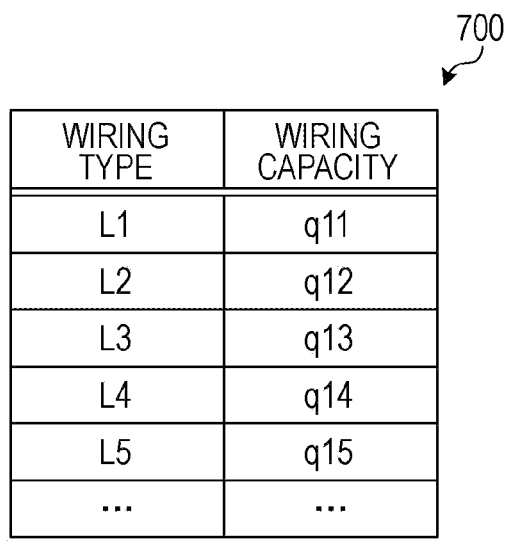
FIG. 7 illustrates an exemplary wiring library.

FIG. 7 illustrates an exemplary wiring library. In the wiring library 700, wiring capacities are stored per wiring type. The wiring types of lines of wiring, for example, coupling lines between cells illustrated in FIGS. 4 and 5 are prescribed and hence the wiring capacity of wiring may be specified from the wiring type thereof.

Figure 8:
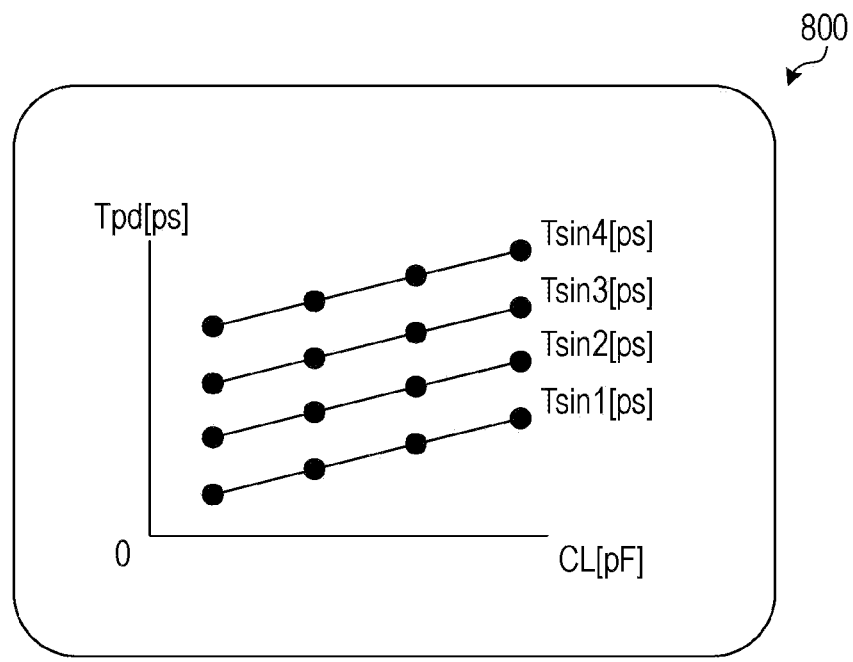
FIG. 8 illustrates an exemplary delay characteristics.

FIG. 8 illustrates an exemplary delay characteristics. The horizontal axis denotes an output capacity CL of each cell, for example, a capacity of the input pin of a cell at a succeeding stage+a wiring capacity of wiring coupled to the input pin. The vertical axis denotes a delay time Tpd intrinsic to each cell. Tsin1 to Tsin4 denote input throughputs. The input pin capacity of the cell at the succeeding stage is read from the cell library 500, the wiring capacity of the wiring coupled to the input pin of the cell at the succeeding stage is read from the wiring library 700, and these capacities are added together to obtain the capacity CL. A corresponding input throughput is specified from within the throughputs Tsin1 to Tsin4 and a delay time Tpd corresponding to the capacity CL is subtracted therefrom.

In the case that an input terminal and a macro, for example, flip flips FFs are installed at the preceding stages of a cell, an input throughput which substantially coincides with or is approximate to an input throughput, which is given in advance as a constraint condition, is selected from within the input throughputs Tsin1 to Tsin4. In the case that a cell is installed at the preceding stage of a cell, an output throughput of the cell at the preceding stage is defined as an input throughput and an input throughput which substantially coincides with or is approximated to the above mentioned throughput is selected from within the throughputs Tsin1 to Tsin4. In the case that an output terminal and a macro, for examples, flip flips FFs are installed at the succeeding stages of a cell, a delay time Ppd corresponding to the output capacity CL, which is given in advance as a constraint condition, is subtracted therefrom.

Figure 9:
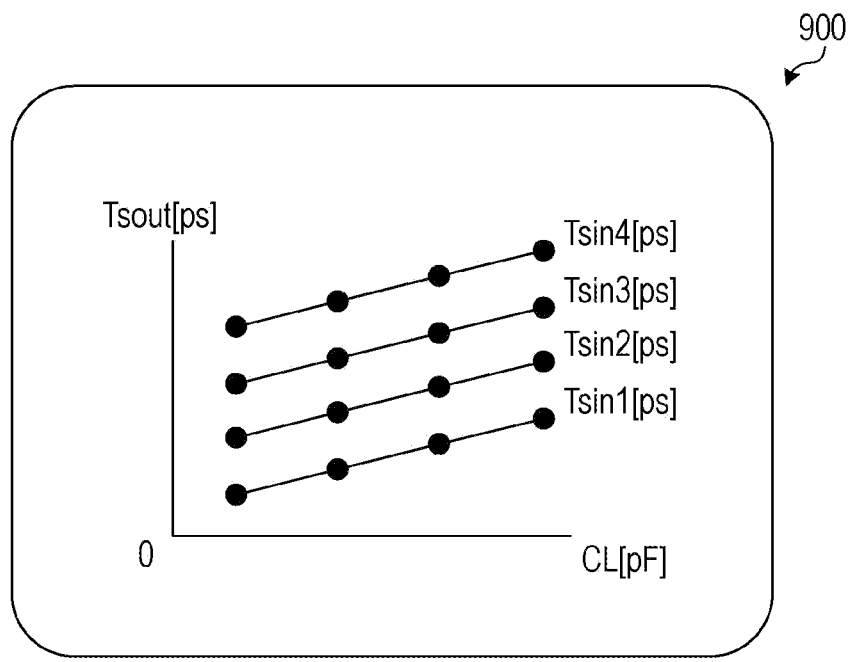
FIG. 9 illustrates an exemplary throughput characteristics.

FIG. 9 illustrates an exemplary throughput characteristics. The horizontal axis denotes an output capacity CL of each cell, for example, a capacity of the input pin of a cell at a succeeding stage+a wiring capacity of wiring coupled to the input pin. The vertical axis denotes an output throughput Tsout intrinsic to each cell. The input pin capacity of the cell at the succeeding stage is read from the cell library 500, the wiring capacity of the wiring coupled to the input pin of the cell at the succeeding stage is read from the wiring library 700 and these capacities are added together to obtain the capacity CL. A corresponding input throughput is specified from within the throughputs Tsin1 to Tsin4 and the output throughput Tsout corresponding to the capacity CL is subtracted therefrom. The subtracted output throughput is used as the input throughput of the cell at the succeeding stage.

The partitioned path variation value γ, the connection value β and the first partitioned path propagation delay time T1 of each partitioned path are obtained. These values are substituted into the equation (4) to calculate the second partitioned path propagation delay time T2.

The source path propagation delay time calculating section 307 illustrated in FIG. 3 merges the partitioned path propagation delay times for the respective partitioned paths calculated by the partitioned path propagation delay time calculating section 306 to calculate the source path propagation delay time T3. The source path propagation delay time calculating section 307 calculates the source path propagation delay time T3, for example, by summing up the second partitioned path propagation delay times T2 for the respective partitioned paths.

The output section 308 outputs the source path propagation delay time T3. The output section 308 outputs the delay time T3, for example, by displaying it on the display 208, by printing it using the printer 213 or by transmitting it to an external device via the I/F 209. The output section 308 may make the source path propagation delay time T3 store in a storage such as the RAM 203, the magnetic disk 205 or the optical disk 207.

Figure 10:
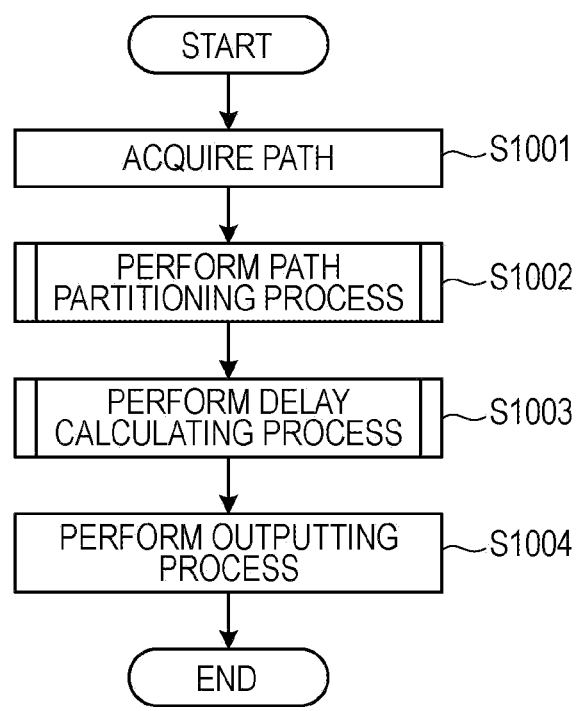
FIG. 10 illustrates exemplary procedures of a design supporting process.

FIG. 10 illustrates an exemplary design supporting process. The design supporting process illustrated in FIG. 10 may be executed by the design supporting device 300 illustrated in FIG. 3. The acquiring section 301 acquires a path (operation S1001). The partitioning section 302 partitions the path (operation S1002). The partitioned path variation value calculating section 305, the partitioned path propagation delay time calculating section 306 and the source path propagation delay time calculating section 307 execute calculations to obtain a delay time (operation S1003). The output section 308 outputs the obtained source path propagation delay time T3 (operation S1004).

Figure 11:
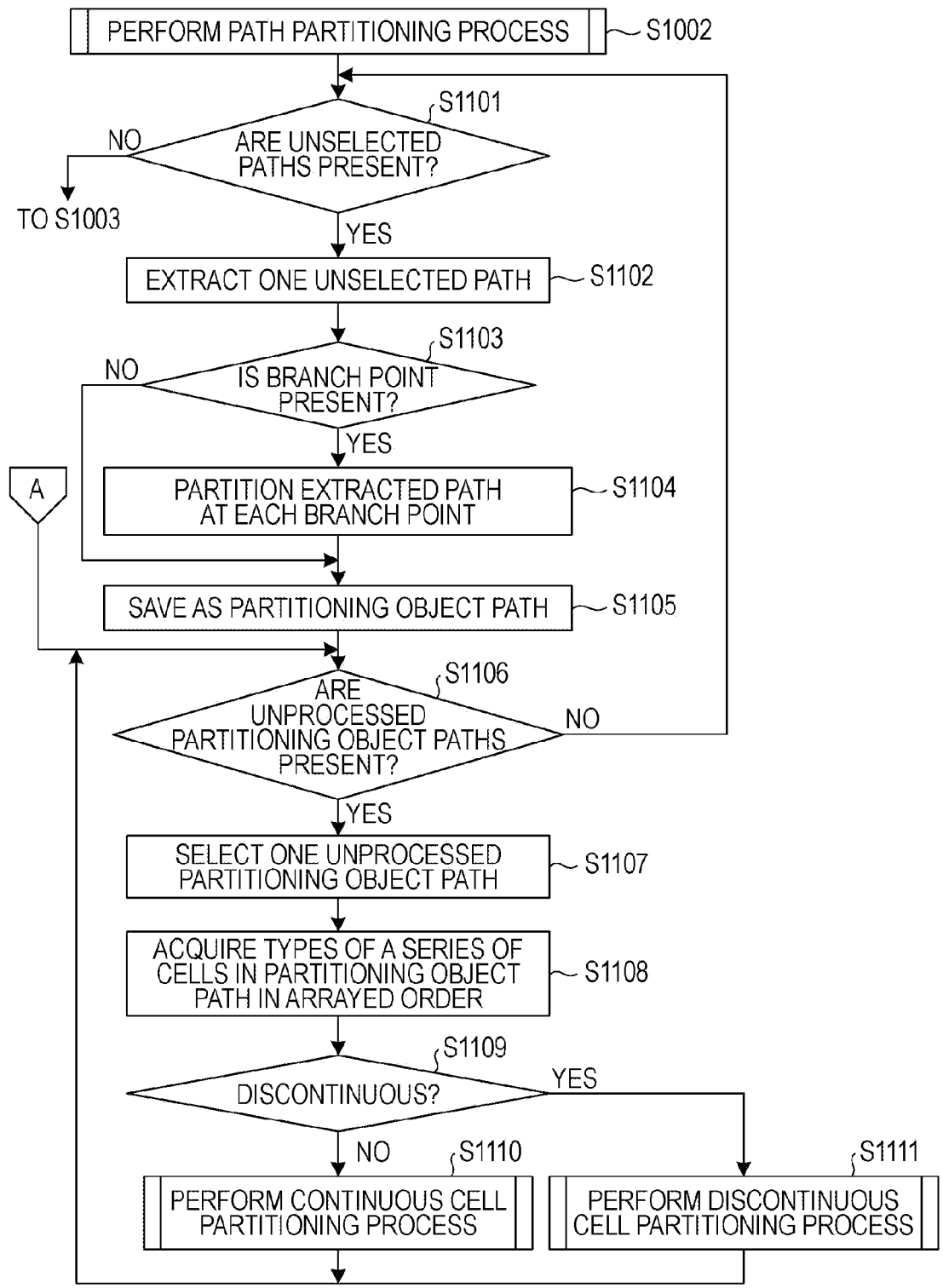
FIG. 11 illustrates an exemplary path partitioning process.

FIG. 11 illustrates an exemplary path partitioning process. The path partitioning process illustrated in FIG. 11 may be executed in operation S1002 illustrated in FIG. 10. Whether unselected paths are present in a group of paths acquired by the acquiring section 301 or not is judged (operation S1101). When the unselected paths are present (operation S1101: Yes), one unselected path is extracted from the paths (operation S1102). Whether branch points are included in the extracted path or not is judged (operation S1103).

When the branch points are included in the extracted path (operation S1103: Yes), the extracted path is partitioned at each branch point as a boundary (operation S1104) and the process proceeds to operation S1105. When any branch point is not included in the path (operation S1103: No), the process proceeds to operation S1105. In operation S1105, the extracted path obtained by executing operation S1103 or the partitioned path obtained by executing operation S1104 is saved as a path which is an object to be partitioned (hereinafter, referred to as a partitioning object path) (operation S1105).

Whether unprocessed partitioning object paths are present or not is judged (operation S1106). When the unprocessed partitioning object paths are present (operation S1106: Yes), one of the unprocessed partitioning object paths is selected (operation S1107) and the cell types of a series of cells in the partitioning object path are acquired in the arrayed order (operation S1108). Whether cells of the same type are arrayed discontinuously or not is judged (operation S1109). Continuity is judged depending on whether the cells of substantially the same type are series-coupled by a given number of stages. When the cells are series-coupled by the given number of stages, it is judged to be continuous and when not, it is judged to be discontinuous.

When the cells are not discontinuous (operation S1109: No), a continuous cell partitioning process is performed (operation S1110) and the process returns to operation S1106. When the cells are discontinuous (operation S1109: Yes), a discontinuous cell partitioning process is performed (operation S1111) and the process returns to operation S1106. In operation S1106, when there is no unprocessed partitioning object path (operation S1106: No), the process returns to operation S1101. In operation S1101, when there is no unselected path (operation 1101: No), the process proceeds to a delay calculating process (operation S1003).

Figure 12:
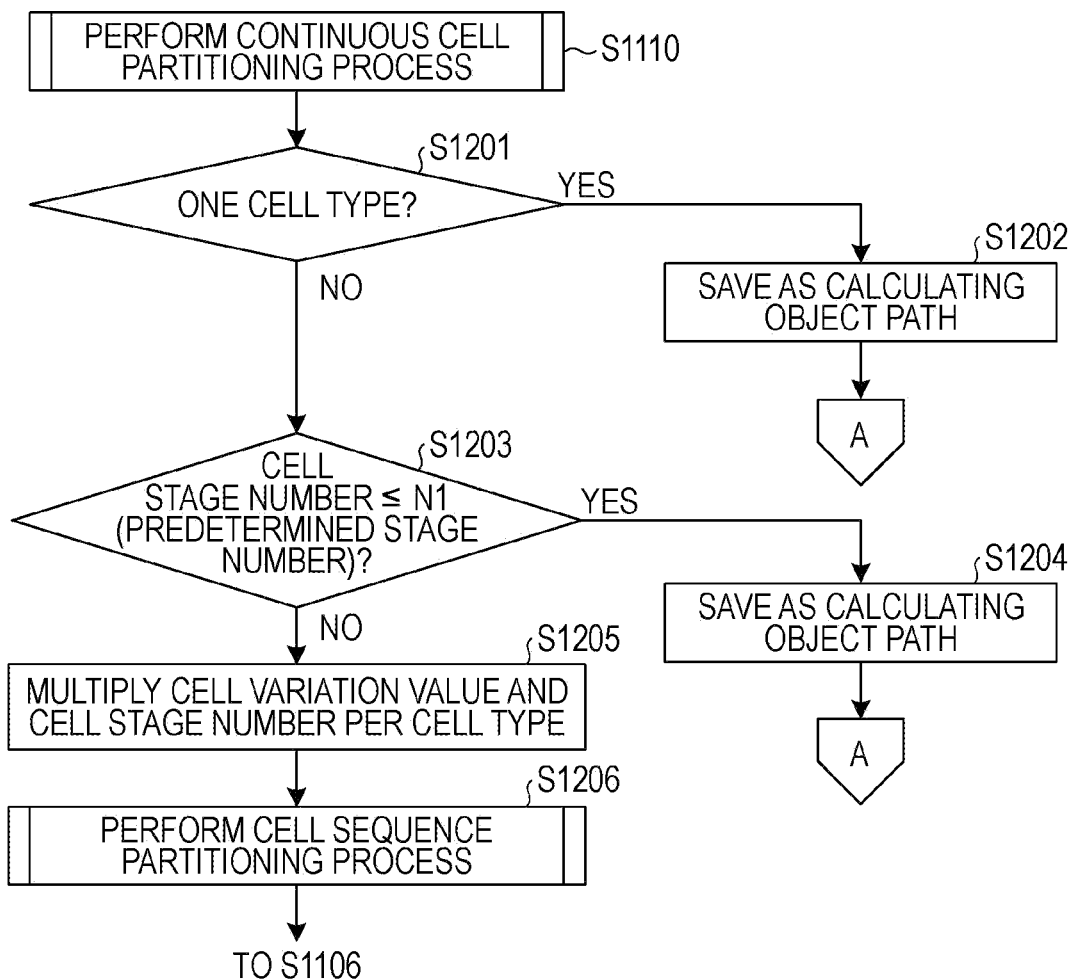
FIG. 12 illustrates an exemplary process of partitioning continuous cells.

FIG. 12 illustrates an exemplary continuous cell partitioning process. The continuous cell partitioning process illustrated in FIG. 12 may be performed in operation S1110 illustrated in FIG. 11. Whether the number of cell types of the group of cells in the partitioning object path is one or not is judged (operation S1201). When the cell type is one (operation S1201: Yes), the path is saved as a path which is an object to be calculated (hereinafter, referred to as a calculating object path) (operation S1202) and the process returns to operation S1106 illustrated in FIG. 11.

When the number of cell types is not one (operation S1201: No), whether the number of stages of cells in the partitioning object path is less than or equal to the given stage number N1 or not is judged (operation S1203). When the cell number is less than or equal to the given stage number N1 (operation S1203: Yes), the path is saved as a calculating object path (operation S1204) and the process returns to operation S1106 illustrated in FIG. 11. When the cell number is not less than or equal to the given stage number N1 (operation S1203: No), the cell variation value and the cell stage number are multiplied per cell type (operation S1205), a cell sequence partitioning process is performed (operation S1206) and the process proceeds to operation S1106.

Figure 13:
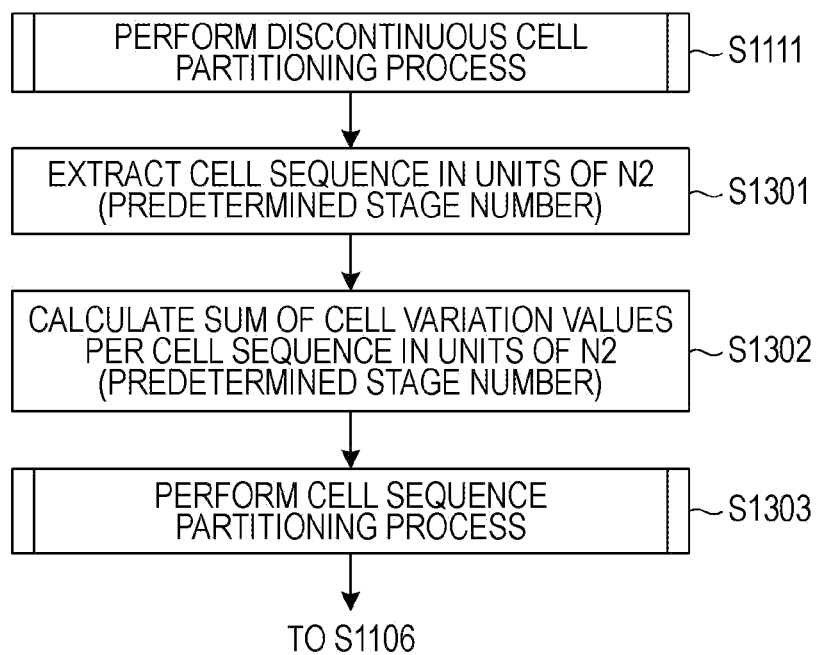
FIG. 13 illustrates an exemplary process of partitioning discontinuous cells.

FIG. 13 illustrates an exemplary discontinuous cell partitioning process. The discontinuous cell partitioning process illustrated in FIG. 13 may be the discontinuous cell partitioning process (operation S1111) illustrated in FIG. 11. Cells sequences are extracted in units of a given stage number N2 (operation S1301). The sum of the cell variation values is calculated per cell sequence of cells arrayed in units of the given stage number N2 (operation S1302). The cell sequence partitioning process is performed (operation S1303) and the process proceeds to operation S1106.

Figure 14:
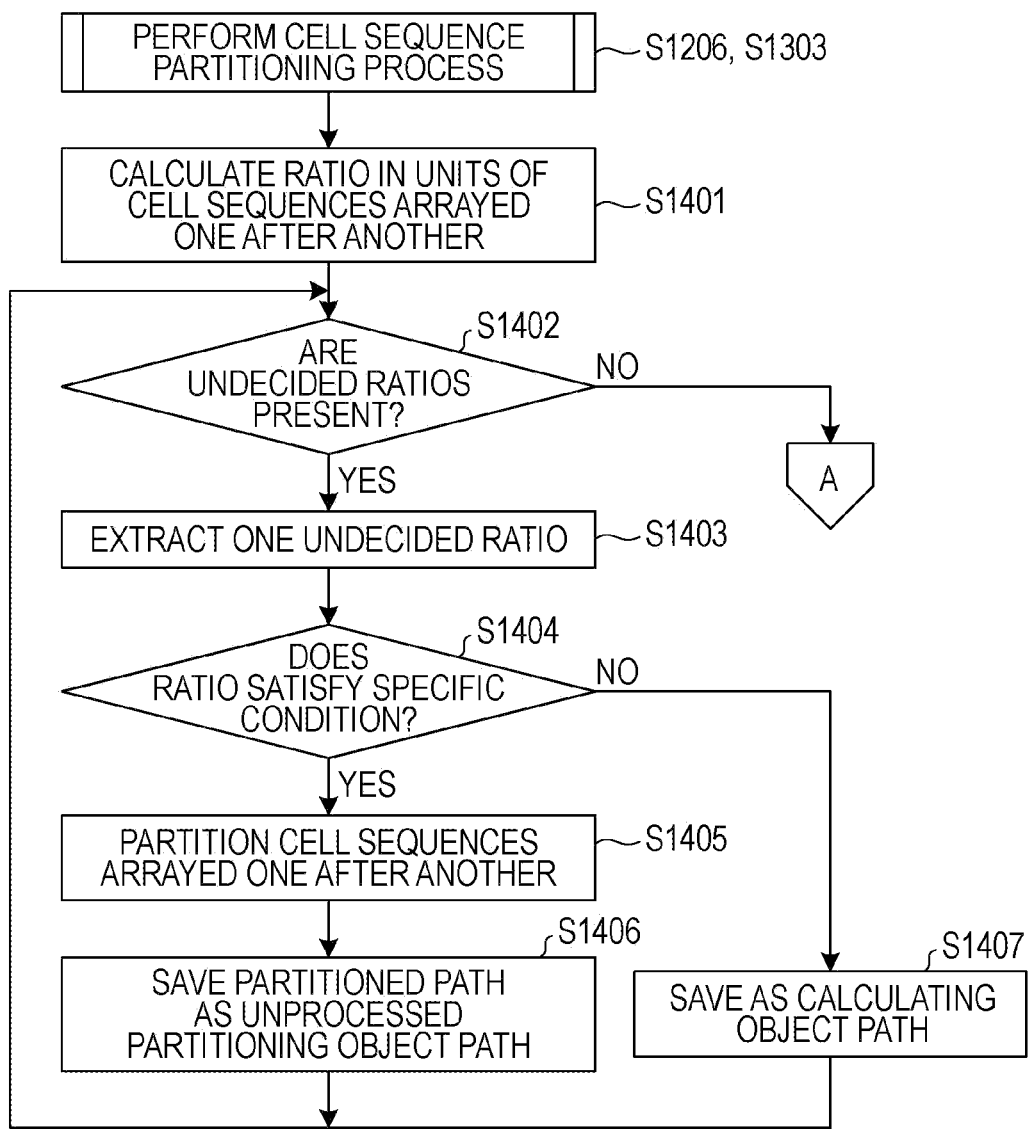
FIG. 14 illustrates an exemplary cell sequence partitioning process.

FIG. 14 illustrates an exemplary cell sequence partitioning process. The cell sequence partitioning process illustrated in FIG. 14 may be the cell sequence partitioning process(es) (operation S1206 and/or operation S1303) illustrated in FIG. 12 or FIG. 13. A ratio is calculated in units of cell sequences arrayed one after another (operation S1401). Whether undecided ratios are present or not is judged (operation S1402). When the undecided ratios are present (operation S1402: Yes), one undecided ratio is extracted (operation S1403) and whether the ratio satisfies a specific condition or not, for example, whether the ratio is more than or equal to a threshold value or not is judged (operation S1404).

When the ratio satisfies the specific condition (operation S1404: Yes), cell sequences arrayed one after another are partitioned (operation S1405). Partitioned paths are saved as unprocessed partitioning object paths (operation S1406) and the process returns to operation S1402. When the ratio does not satisfy the specific condition (operation S1404: No), the partitioned paths are saved as calculating object paths (operation S1407) and the process returns to operation S1402. In operation S1402, when any undecided ratio is not present (operation S1402: No), the process returns to operation S11016 in FIG. 11.

Figure 15:
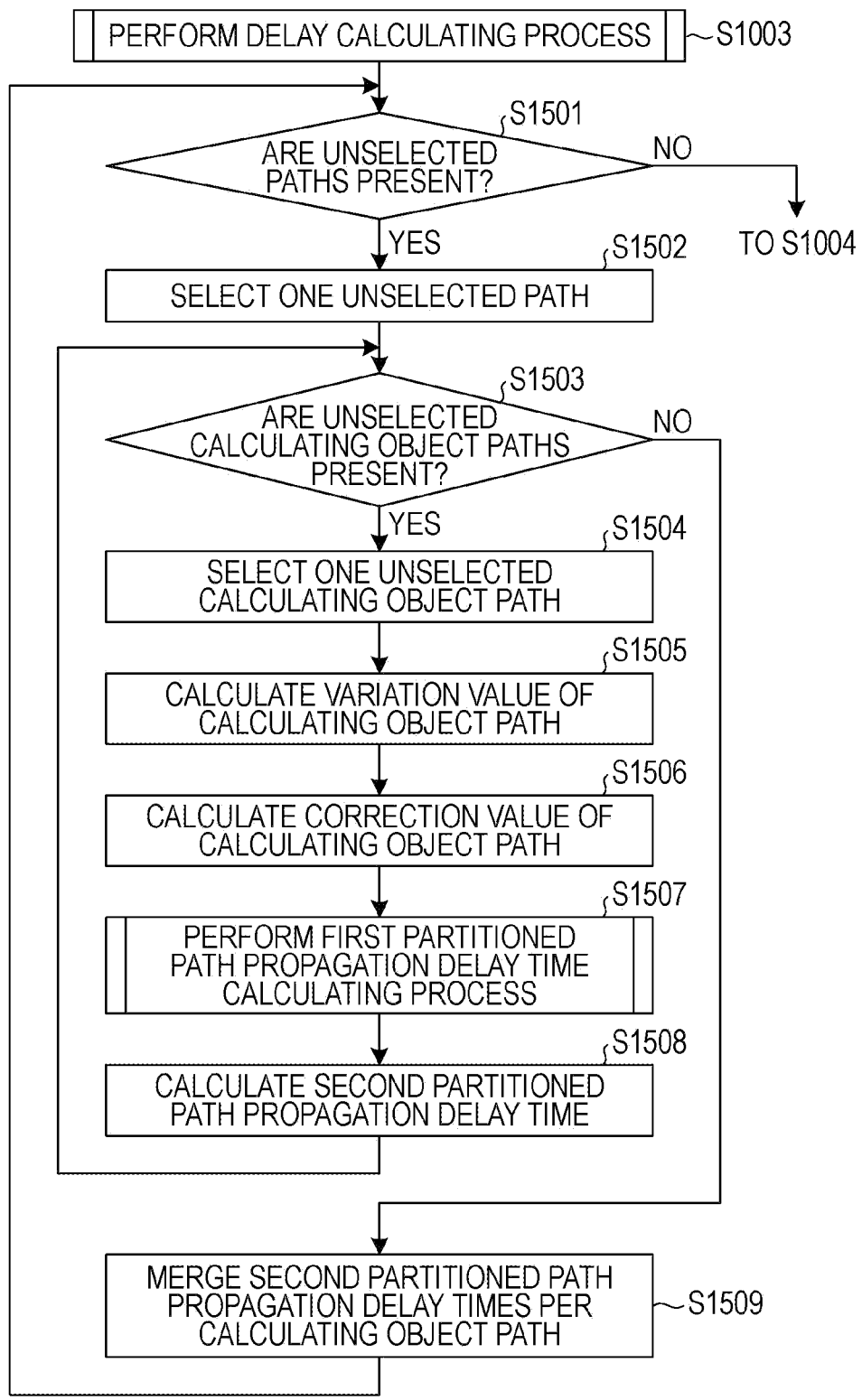
FIG. 15 illustrates an exemplary delay calculating process.

FIG. 15 illustrates an exemplary delay calculating process. The delay calculating process illustrated in FIG. 15 may be the delay calculating process (operation S1003) illustrated in FIG. 10. Whether unselected paths are present in the group of paths acquired by the acquiring section 301 or not is judged (operation S1501) and when the unselected paths are present (operation S1501: Yes), one of the unselected paths is selected (operation S1502). Whether unselected calculating object paths are present in the selected path or not is judged (operation S1503).

When the unselected calculating object paths are present (operation S1503: Yes), one of the unselected calculating object paths is selected (operation S1504) and the variation value of the selected calculating object path, for example, the partitioned path variation value $\gamma$ is calculated (operation S1505). Then, the correction value $\beta$ of the calculating object path is calculated (operation S1506). Then, the first partitioned path propagation delay time T1 of the calculating object path is calculated (operation S1507).

The second partitioned path propagation delay time T2 of the calculating object path is calculated (operation S1508) and the process returns to operation S1503. In operation 1503, when any unselected calculating object path is not present (operation S1503: No), the second partitioned path propagation delay times T2 for each calculating object path are merged (operation S1509). As a result, the final source path propagation delay time T3 of one path is obtained. The process returns to operation S1501. In operation S1501, when any unselected path is not present (operation S1501: No), the process proceeds to the process of outputting the source path propagation delay time T3 for each path (operation S1004).

Figure 16:
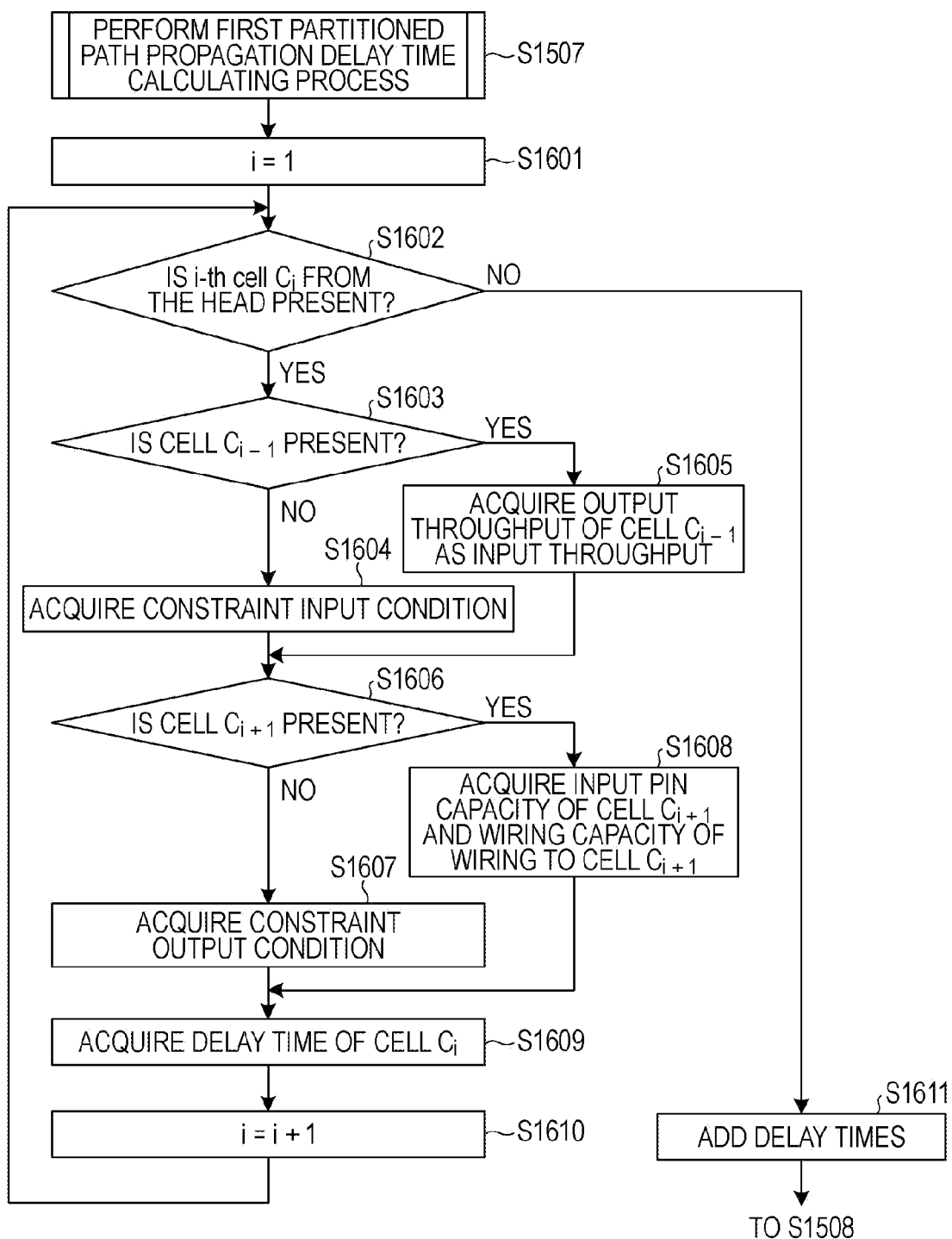
FIG. 16 illustrates an exemplary partitioned path propagation delay time calculating process.

FIG. 16 illustrates an exemplary first partitioned path propagation delay time calculating process. The first partitioned path propagation delay time calculating process illustrated in FIG. 16 may be the first partitioned path propagation delay time calculating process (operation S1507) illustrated in FIG. 15. A variable "i" is set to 1 (i=1) (operation S1601) and whether the i-th cell Ci counted from the head of a calculating object path is present or not is judged (operation S1602). When the cell Ci is present (operation S1602: Yes), whether the cell Ci−1 is present or not is judged (operation S1603). When the Cell Ci−1 is not present (operation S1603: No), a constraint input condition, for example, a given input throughput is acquired (operation S1604) and the process proceeds to operation S1606.

When the cell Ci−1 is present (operation S1603: Yes), the output throughput of the cell Ci−1 is acquired as the input throughput (operation S1605) and the process proceeds to operation S1606. In operation S1606, whether the cell Ci+1 is present or not is judged (operation S1606). When the cell Ci+1 is not present (operation S1606: No), a constraint output condition, for example, a given output capacity is acquired (operation S1607) and the process proceeds to operation S1609. When the cell Ci+1 is present (operation S1606: Yes), the input pin capacity of the cell Ci+1 and the wiring capacity of the wiring coupled to the cell Ci+1 are acquired (operation S1608) and the process proceeds to operation S1609.

In operation S1609, the delay time Tpd of the cell Ci is acquired from the delay characteristics graph 800 (operation S1609). "i" is incremented by one (operation S1610) and the process returns to operation S1602. In operation S1602, when the cell Ci is not present (operation S1602: No), all the delay times acquired in operation S1609 are added to obtain the first partitioned path propagation delay time T1 (operation S1611) and the process proceeds to operation S1508.

When the propagation delay time of each path is to be estimated, the partitioned path variation values of respective partitioned paths are calculated. Therefore, a fluctuation in the propagation delay time of each partitioned path, for example, the second partitioned path propagation delay time T2 may be reduced. The source path propagation delay time T3 may be properly estimated by merging the second partitioned path propagation delay times T2 of respective partitioned paths. In addition, the estimation is realized by performing a simple calculating process.

A path is partitioned at each branch point as a boundary, so that the influence of a delay error induced by capacity and resistance of metal wiring before and behind each branch point is reduced and hence the accuracy of the obtained second partitioned path propagation delay time T2 may be increased.

Since each path is partitioned in units of continuous cell sequences of the same type, batch calculation is allowed due to the presence of the cells of the same type and the accuracy of each second partitioned path propagation delay time T2 may be increased.

Since whether partition may be performed or not is judged by comparing with each other the variation values of the cell sequences arrayed one after another, useless partition is eliminated. If a path is partitioned at a position where partition is unnecessary, the computational complexity may be increased as the number of partitioned paths is increased. The number of partitioned paths is optimized by eliminating the useless partition.

Even if cells of different types are included in a path, the path may be partitioned in units of the appropriate number of stages of cells.

As for the design supporting program according to the embodiments, for example, a design supporting program which is prepared in advance may be executed by a computer such as a personal computer or a work station. The program may be recorded in a computer-readable recording medium such as a hard disk, a flexible disk, a CD-ROM, an MO or a DVD and may be read from the recording medium using a computer. The program may be distributed over a network such as Internet.

Example embodiments of the present invention have now been described in accordance with the above advantages. It will be appreciated that these examples are merely illustrative of the invention. Many variations and modifications will be apparent to those skilled in the art.

Although a few preferred embodiments of the present invention have been shown and described, it would be appreciated by those skilled in the art that changes may be made in these embodiments without departing from the principles and spirit of the invention, the scope of which is defined in the claims and their equivalents.

The invention claimed is:

1. A design supporting method, comprising causing a computer processor to execute the operations of:
   partitioning a source path of circuit information into partitioned paths, the source path is partitioned in units of cell sequences of cells of the same type included in the source path;
   calculating a variation value of a first cell sequence of the cell sequences having a first cell type based on variation values of cells of the first cell sequence and the number of cells of the first cell sequence;
   calculating a variation value of a second cell sequence of the cell sequences having a second cell type based on variation values of cells of the second cell sequence and the number of the cells of the second cell sequence;
   judging whether partition of the first cell sequence and second cell sequence is preformed respectively based on the variation value of the first cell sequence and the variation value of the second cell sequence;
   partitioning at least one of the first cell sequence and second cell sequence based on said judging;
   calculating a variation value of each of the partitioned paths based on variation values on a delay of a cell included in the corresponding partitioned path;
   calculating a partition propagation delay time of each of the partitioned paths based on the variation value of the corresponding partitioned path; and
   calculating a source propagation delay time of the source path by merging the partition propagation delay time of each of the partitioned paths.

2. The design supporting method according to claim 1, wherein
   the source path is partitioned based on a branch in the source path.

3. A design supporting method, comprising causing a computer processor to execute the operations of:
   partitioning a source path of circuit information into partitioned paths, the source path is partitioned in units of cell sequences of cells of the same type included in the source path;
   calculating a variation value of a first cell sequence of the cell sequences based on variation values of cells of the first cell sequence and the number of the cells of the first cell sequence;
   calculating a variation value of a second cell sequence of the cell sequences, which follows the first cell sequence, based on variation values of cells of the second cell sequence and the number of the cells of the second cell sequence;
   judging whether partition of the first cell sequence and second cell sequence is performed based on the variation values of the first cell sequence and the second cell sequence respectively;
   partitioning at least one of the first cell sequence and the second cell sequence based on said judging;
   calculating a variation value of each of the partitioned paths based on variation values on a delay of a cell included in the corresponding partitioned path;
   calculating a partition propagation delay time of each of the partitioned paths based on the variation value of the corresponding partitioned path; and
   calculating a source propagation delay time of the source path by merging the partition propagation delay time of each of the partitioned paths.

4. A design supporting device comprising:
   a partitioning section that partitions a partition path of circuit information into partitioned paths, the source path is partitioned in units of cell sequences of cells of the same type included in the source path;
   a cell sequence variation section that calculates a variation value of a first cell sequence of the cell sequences having a first cell type based on variation values of cells of the first cell sequence and the number of cells of the first cell sequence, and calculates a variation value of a second cell sequence of the cell sequences having a second cell type based on variation values of cells of the second cell sequence and the number of the cells of the second cell sequence;
   a control section that judges whether partition of the first cell sequence and second cell sequence is preformed respectively based on the variation value of the first cell sequence and the variation value of the second cell sequence; and partitions at least one of the first cell sequence and second cell sequence based on the judgment;
   a partitioned path variation value calculating section that calculates a variation value of each of the partitioned paths based on variation values on a delay of a cell included in the corresponding partitioned path;

a partitioned path propagation delay time calculating section that calculates a partition propagation delay time of each of the partitioned paths based on the variation value of the corresponding partitioned path; and a source path propagation delay time calculating section that calculates a source propagation delay time of the source path by merging the propagation delay time of each of the partitioned paths.

5. A non-transitory computer-readable recording medium that stores therein a design supporting program, the design supporting program causing a computer processor to execute operations of:

partitioning a partition path of circuit information into partitioned paths, the source path is partitioned in units of cell sequences of cells of the same type included in the source path;

calculating a variation value of a first cell sequence of the cell sequences having a first cell type based on variation values of cells of the first cell sequence and the number of cells of the first cell sequence;

calculating a variation value of a second cell sequence of the cell sequences having a second cell type based on variation values of cells of the second cell sequence and the number of the cells of the second cell sequence;

judging whether partition of the first cell sequence and second cell sequence is preformed respectively based on the variation value of the first cell sequence and the variation value of the second cell sequence; and partitioning at least one of the first cell sequence and second cell sequence based on said judging;

calculating a variation value of each of the partitioned paths based on variation values on a delay of a cell included in the corresponding partitioned path;

calculating a partition propagation delay time of each of the partitioned paths based on the variation value of the corresponding partitioned path; and calculating a source propagation delay time of the source path by merging the propagation delay time of each of the partitioned paths.

6. A design supporting device comprising:

a partitioning section that partitions a partition path of circuit information into partitioned paths, the source path is partitioned in units of cell sequences of cells of the same type included in the source path;

a cell sequence variation section that calculates a variation value of a first cell sequence of the cell sequences based on variation values of cells of the first cell sequence and the number of the cells of the first cell sequence, and calculates a variation value of a second cell sequence of the cell sequences, which follows the first cell sequence, based on variation values of cells of the second cell sequence and the number of the cells of the second cell sequence;

a control section that judges whether partition of the first sequence and second cell sequence is performed based on the variation values of the first cell sequence and the second cell sequence respectively; and partitions at least one of the first cell sequence and the second cell sequence based on the judgment;

a partitioned path variation value calculating section that calculates a variation value of each of the partitioned paths based on variation values on a delay of a cell included in the corresponding partitioned path;

a partitioned path propagation delay time calculating section that calculates a partition propagation delay time of each of the partitioned paths based on the variation value of the corresponding partitioned path; and a source path propagation delay time calculating section that calculates a source propagation delay time of the source path by merging the propagation delay time of each of the partitioned paths.

7. A non-transitory computer-readable recording medium that stores therein a design supporting program, the design supporting program causing a computer processor to execute operations of:

partitioning a source path of circuit information into partitioned paths, the source path is partitioned in units of cell sequences of cells of the same type included in the source path;

calculating a variation value of a first cell sequence of the cell sequences based on variation values of cells of the first cell sequence and the number of the cells of the first cell sequence;

calculating a variation value of a second cell sequence of the cell sequences, which follows the first cell sequence, based on variation values of cells of the second cell sequence and the number of the cells of the second cell sequence;

judging whether partition of the first sequence and second cell sequence is performed based on the variation values of the first cell sequence and the second cell sequence respectively;

partitioning at least one of the first cell sequence and the second cell sequence based on said judging;

calculating a variation value of each of the partitioned paths based on variation values on a delay of a cell included in the corresponding partitioned path;

calculating a partition propagation delay time of each of the partitioned paths based on the variation value of the corresponding partitioned path; and calculating a source propagation delay time of the source path by merging the partition propagation delay time of each of the partitioned paths.

* * * * *

UNITED STATES PATENT AND TRADEMARK OFFICE
CERTIFICATE OF CORRECTION

| | | |
|---|---|---|
| PATENT NO. | : 8,423,944 B2 | Page 1 of 1 |
| APPLICATION NO. | : 12/640677 | |
| DATED | : April 16, 2013 | |
| INVENTOR(S) | : Mitsuru Onodera | |

It is certified that error appears in the above-identified patent and that said Letters Patent is hereby corrected as shown below:

Title Page, Item (54) and in the specification, Col. 1, Line 1, Title, before "SUPPORTING" insert -- DESIGN --.

In the Specification:

Column 14, Line 4, In Claim 6, delete "first" and insert -- first cell --, therefor.

Column 14, Line 39, In Claim 7, delete "first sequence" and insert -- first cell sequence --, therefor.

Signed and Sealed this
Thirteenth Day of August, 2013

Teresa Stanek Rea
*Acting Director of the United States Patent and Trademark Office*